United States Patent
Miyazawa

(10) Patent No.: US 10,767,019 B2
(45) Date of Patent: Sep. 8, 2020

(54) RESIN COMPOSITION, MICROPOROUS MEMBRANE, SEPARATOR AND SECONDARY BATTERY

(71) Applicant: ZEON CORPORATION, Chiyoda-ku, Tokyo (JP)

(72) Inventor: Shinsuke Miyazawa, Tokyo (JP)

(73) Assignee: ZEON CORPORATION, Chiyoda-ku, Tokyo (JP)

( * ) Notice: Subject to any disclaimer, the term of this patent is extended or adjusted under 35 U.S.C. 154(b) by 19 days.

(21) Appl. No.: 15/759,311

(22) PCT Filed: Sep. 20, 2016

(86) PCT No.: PCT/JP2016/077741
§ 371 (c)(1),
(2) Date: Mar. 12, 2018

(87) PCT Pub. No.: WO2017/057109
PCT Pub. Date: Apr. 6, 2017

(65) Prior Publication Data
US 2018/0179341 A1    Jun. 28, 2018

(30) Foreign Application Priority Data
Sep. 28, 2015  (JP) ................................ 2015-190364

(51) Int. Cl.

| | | |
|---|---|---|
| C08J 3/11 | (2006.01) | |
| C08L 101/02 | (2006.01) | |
| C08J 5/18 | (2006.01) | |
| H01M 2/16 | (2006.01) | |
| C08L 23/10 | (2006.01) | |
| H01M 2/14 | (2006.01) | |
| C08G 61/08 | (2006.01) | |
| C08L 45/00 | (2006.01) | |
| C08L 23/06 | (2006.01) | |
| C08L 23/12 | (2006.01) | |
| C08F 8/04 | (2006.01) | |
| C08F 4/78 | (2006.01) | |
| G01N 25/48 | (2006.01) | |
| G01R 33/46 | (2006.01) | |

(52) U.S. Cl.
CPC . *C08J 3/11* (2013.01); *C08F 4/78* (2013.01); *C08G 61/08* (2013.01); *C08J 5/18* (2013.01); *C08L 23/10* (2013.01); *C08L 45/00* (2013.01); *C08L 101/02* (2013.01); *H01M 2/145* (2013.01); *H01M 2/162* (2013.01); *H01M 2/1653* (2013.01); *C08F 8/04* (2013.01); *C08G 2261/3324* (2013.01); *C08G 2261/418* (2013.01); *C08G 2261/724* (2013.01); *C08J 2347/00* (2013.01); *C08J 2423/06* (2013.01); *C08L 23/06* (2013.01); *C08L 23/12* (2013.01); *C08L 2201/56* (2013.01); *C08L 2203/16* (2013.01); *C08L 2203/20* (2013.01); *G01N 25/4866* (2013.01); *G01R 33/46* (2013.01)

(58) Field of Classification Search
CPC ........ C08F 4/78; C08F 8/04; C08G 2261/418; C08G 61/08; C08G 2261/3324; C08G 2261/724; C08J 3/11; C08J 5/18; C08J 2347/00; C08J 2423/06; C08L 23/06; C08L 23/10; C08L 23/12; C08L 45/00; C08L 101/102; C08L 101/02; C08L 2201/56; C08L 2203/16; H01M 2/145; H01M 2/162; H01M 2/1653
See application file for complete search history.

(56) References Cited

U.S. PATENT DOCUMENTS

| | | | |
|---|---|---|---|
| 5,939,181 A | 8/1999 | Kumano et al. | |
| 2004/0146786 A1* | 7/2004 | Sato ...................... | H01G 9/038 |
| | | | 429/326 |
| 2015/0273803 A1* | 10/2015 | Maruichi ................ | B32B 27/08 |
| | | | 428/516 |

(Continued)

FOREIGN PATENT DOCUMENTS

| | | | |
|---|---|---|---|
| JP | S4930263 B1 | | 8/1974 |
| JP | 07-133363 | * | 5/1995 |
| JP | H10204199 A | | 8/1998 |

(Continued)

OTHER PUBLICATIONS

Machine translation of WO 2009/001724, published on Dec. 31, 2008 (Year: 2008).*

(Continued)

*Primary Examiner* — Anca Eoff
(74) *Attorney, Agent, or Firm* — Kenja IP Law PC

(57) ABSTRACT

The invention is a resin composition containing following polymer (A) and polymer (B), wherein a content of the polymer (A) is 1 to 80 wt % based on the total weight of the polymer (A) and the polymer (B), polymer (A) is a alicyclic structure-containing hydrogenated polymer having a heat distortion temperature of 170° C. or higher, polymer (B) is a polymer incompatible with the polymer (A) and having a heat distortion temperature of lower than 170° C., a microporous film formed by using the resin composition, a separator including the microporous film, and a secondary battery having the separator. One aspect of the invention provides a resin composition suitably used as a raw material for a separator of a secondary battery excellent in safety, a microporous film obtained by forming the resin composition, a separator including the microporous film, and a secondary battery having the separator.

6 Claims, No Drawings

(56) References Cited

U.S. PATENT DOCUMENTS

2016/0137794 A1* 5/2016 Yamada .............. B29C 55/08
525/332.1

FOREIGN PATENT DOCUMENTS

| | | | |
|---|---|---|---|
| JP | H10298324 A | | 11/1998 |
| JP | 2001200081 A | | 7/2001 |
| JP | 2002249553 A | | 9/2002 |
| JP | 2002249645 A | | 9/2002 |
| JP | 2007016102 A | | 1/2007 |
| JP | 2007-137981 | * | 6/2007 |
| JP | 5564945 B2 | | 8/2014 |
| WO | 2009001724 A1 | | 12/2008 |
| WO | 2012033076 A1 | | 3/2012 |
| WO | WO2014/080777 | * | 5/2014 |
| WO | WO 2015/002019 | * | 1/2015 |

OTHER PUBLICATIONS

Machine translation of JP 07-133363, published on May 23, 1995 (Year: 1995).*
Machine translation of JP 2007-137981, published on Jun. 7, 2007 (Year: 2007).*
Nov. 22, 2016, International Search Report issued in the International Patent Application No. PCT/JP2016/077741.

* cited by examiner

RESIN COMPOSITION, MICROPOROUS MEMBRANE, SEPARATOR AND SECONDARY BATTERY

TECHNICAL FIELD

The present invention relates to a resin composition which is suitably used as a raw material of a separator for a secondary battery excellent in safety, a microporous film obtained by forming the resin composition, a separator including the microporous film, and a secondary battery having the separator.

BACKGROUND ART

A secondary battery such as a lithium ion battery generally includes members such as a positive electrode, a negative electrode and a separator.

The separator typically includes a resin microporous film and is disposed between a positive electrode and a negative electrode. The separator plays a role of separating the positive electrode and the negative electrode to prevent internal short circuit due to contact between both electrodes, and a role of allowing ions such as lithium ions to pass therethrough to enable discharge and charge of the secondary battery.

Conventionally, as a separator including a resin microporous film, a microporous film containing polyethylene having a specific weight average molecular weight and polypropylene having a specific weight average molecular weight, and a separator including this microporous film (Patent Literature 1), a microporous film obtained by using a polyethylene composition containing an ultrahigh molecular weight polyethylene and a low density polyethylene, and a separator including this microporous film (Patent Literature 2), and the like are known.

The separators described in these literatures contain two or more polymer components. In addition, when the temperature in the battery abnormally increases, a polymer having a lower heat distortion temperature melts to close the micropores, and a polymer having a higher heat distortion temperature holds the structure of the whole separator. These actions of each polymer can suppress movement of ions in the secondary battery to prevent ignition or the like of the secondary battery even when the temperature in the battery abnormally increases.

When ignition or the like of the secondary battery is prevented by such a mechanism, it is desirable that the temperature at which the whole separator melts and deforms (hereinafter referred to as "meltdown temperature" in some cases) is higher.

CITATION LIST

Patent Literature

Patent Literature 1: JP-A-10-298324
Patent Literature 2: JP-A-2001-200081

SUMMARY OF INVENTION

Technical Problem

As described above, Patent Literatures 1 and 2 disclose a microporous film having a high meltdown temperature and a low shutdown temperature.

However, in recent years, a separator having a higher meltdown temperature and a desired shutdown temperature (a temperature at which the micropores are closed) has been desired in order to further enhance the safety and practicality of the secondary battery.

The present invention has been made in view of the above circumstances, and the object of the present invention is to provide a resin composition suitably used as a raw material for a separator of a secondary battery excellent in safety, a microporous film obtained by forming the resin composition, a separator including the microporous film, and a secondary battery having the separator.

Solution to Problem

In order to solve the above problems, the present inventors conducted extensive studies with regard to a microporous film and a resin composition used as a raw material thereof. As a result, they have found that a resin composition containing a specific alicyclic structure-containing hydrogenated polymer and a specific polymer incompatible with the alicyclic structure polymer, in which the content of the alicyclic structure-containing hydrogenated polymer is within a specific range, is suitable as a raw material for producing a separator having a high meltdown temperature and a desired shutdown temperature, and have completed the present invention.

Accordingly, one aspect of the invention provides resin compositions of the following [1] and [2], a microporous film of [3], a separator of [4] and a secondary battery of [5].

[1] A resin composition containing following polymer (A) and polymer (B), wherein a content of the polymer (A) is 1 to 80 wt % based on the total weight of the polymer (A) and the polymer (B).

Polymer (A): an alicyclic structure-containing hydrogenated polymer having a heat distortion temperature of 170° C. or higher Polymer (B): a polymer incompatible with the polymer (A) and having a heat distortion temperature of lower than 170° C.

[2] The resin composition according to [1], wherein a difference between a surface tension of the polymer (A) for water and a surface tension of the polymer (B) for water is 2 mN/m or higher.

[3] A microporous film formed using the resin composition according to [1] or [2], which has a sea-island structure constructed by dispersing the polymer (A) in the polymer (B).

[4] A separator including the microporous film according to [3].

[5] A secondary battery having the separator according to [4].

Advantageous Effects of Invention

One aspect of the invention provides a resin composition suitably used as a raw material for a separator of a secondary battery excellent in safety, a microporous film obtained by forming the resin composition, a separator including the microporous film, and a secondary battery having the separator.

DESCRIPTION OF EMBODIMENTS

Hereinafter, the embodiments of the present invention will be classified into 1) resin composition, 2) microporous film and 3) separator and secondary battery, and described in detail.

1) Resin Composition

A resin composition according to one embodiment of the invention contains the following polymer (A) and polymer (B), wherein the content of the polymer (A) is 1 to 80 wt % based on the total weight of the polymer (A) and the polymer (B).

Polymer (A): an alicyclic structure-containing hydrogenated polymer having a heat distortion temperature of 170° C. or higher Polymer (B): a polymer incompatible with the polymer (A) and having a heat distortion temperature of lower than 170° C.

[Polymer (A)]

The polymer (A) used in the present invention is an alicyclic structure-containing hydrogenated polymer having a heat distortion temperature of 170° C. or higher.

The alicyclic structure-containing hydrogenated polymer is a polymer having an alicyclic structure in its molecule and is a hydrogenated product of a polymer obtained by polymerization reaction using a cycloolefin as a monomer.

Examples of the alicyclic structure in the polymer (A) include a cycloalkane structure and a cycloalkene structure. Above all, the cycloalkane structure is preferred because a resin composition excellent in heat resistance and the like can be easily obtained. The number of carbon atoms constituting the alicyclic structure is not particularly limited but is normally 4 to 30, preferably 5 to 20, and more preferably 5 to 15. The number of carbon atoms constituting the alicyclic structure is within the above range, so that properties such as mechanical strength, heat resistance and formability are highly balanced and thus preferred.

A ratio of the repeating units having alicyclic structures based on all repeating units in the polymer (A) may be appropriately selected depending on the intended purpose, but is normally 30 wt % or higher, preferably 50 wt % or higher, and more preferably 70 wt % or higher. If the ratio of the repeating units having the alicyclic structures in the polymer (A) is excessively low, the polymer (A) tends to be poor in heat resistance.

The remainder other than the repeating units having the alicyclic structures in the polymer (A) is not particularly limited and is appropriately selected.

The heat distortion temperature of the polymer (A) is 170° C. or higher, preferably 200° C. or higher, and more preferably 230° C. or higher.

The heat distortion temperature is represented by a value measured in accordance with JIS K7206.

The heat distortion temperature of the polymer (A) is 170° C. or higher, so that a microporous film having a higher meltdown temperature can be easily obtained.

The heat distortion temperature of the alicyclic structure-containing hydrogenated polymer can be increased e.g. by enhancing its tactic structure.

The weight average molecular weight (Mw) of the polymer (A) is not particularly limited, but is normally 1,000 to 1,000,000, and preferably 2,000 to 500,000. The weight average molecular weight of the polymer (A) is within the above range, so that a resin composition having more excellent balance between formability and heat resistance can be easily obtained.

The molecular weight distribution (Mw/Mn) of the polymer (A) is not particularly limited, but is normally 4.0 or lower, and preferably 3.5 or lower. A polymer having such a molecular weight distribution is more excellent in formability.

The weight average molecular weight (Mw) and the molecular weight distribution (Mw/Mn) of the polymer (A) refer to polystyrene-equivalent values determined by gel permeation chromatography (GPC) using tetrahydrofuran as an eluent.

The polymer (A) can be produced in such a way that a cycloolefin as a monomer is subjected to a ring-opening polymerization reaction or an addition polymerization reaction and a resulting polymer is subjected to a hydrogenation reaction. The reaction conditions and the like for the ring-opening polymerization reaction, the addition polymerization reaction and the hydrogenation reaction are not particularly limited, and a known method can be used.

For the polymer (A), a polymer having crystallinity is preferred because a resin composition more excellent in heat resistance can be easily obtained. The "crystallinity" means a property that a melting point can be observed with a differential scanning calorimeter (DSC) by optimizing measurement conditions and the like, i.e. a property determined depending on the tactic structure of the polymer chain.

When the polymer (A) has crystallinity, its melting point is preferably 180 to 350° C., more preferably 200 to 320° C., and particularly preferably 220 to 300° C.

As the polymer (A) having crystallinity (hereinafter referred to as "polymer ($\alpha$)" in some cases), a known polymer such as a hydrogenated dicyclopentadiene ring-opening polymer having syndiotacticity described in a brochure of WO 2012/033076, a hydrogenated dicyclopentadiene ring-opening polymer having isotacticity described in JP-A-2002-249553, and a hydrogenated norbornene ring-opening polymer described in JP-A-2007-16102 can be used.

As the polymer ($\alpha$), a hydrogenated dicyclopentadiene ring-opening polymer having syndiotacticity (hereinafter referred to as "polymer ($\alpha$1)" in some cases) is preferred. As described later, a polymer incompatible with the polymer (A) is used as the polymer (B) in the present invention, but polymers compatible with the polymer ($\alpha$1) are almost unknown. Hence, the polymer (B) can be selected from various known polymers by using the polymer ($\alpha$1) as the polymer (A).

Although the degree of tactic structure of the polymer ($\alpha$1) is not particularly limited, a polymer having a higher the degree of tactic structure is preferred because a resin composition excellent in heat resistance and the like can be easily obtained.

Specifically, a ratio of racemo diads in the repeating units obtained by subjecting dicyclopentadiene to ring-opening polymerization and subsequently to hydrogenation is preferably 51% or higher, more preferably 60% or higher, and particularly preferably 70% or higher.

The higher the ratio of racemo diads is, i.e. the higher the syndiotacticity is, the higher the melting point of the hydrogenated dicyclopentadiene ring-opening polymer is.

The ratio of the racemo dyads can be measured and quantified by $^{13}$C-NMR spectrum analysis. Specifically, $^{13}$C-NMR measurement is carried out by applying an inverse-gated decoupling method at 200° C. using a mixed solvent of 1,3,5-trichlorobenzene-d3/orthodichlorobenzene-d4 (volume ratio: 2/1) as a solvent, so that the ratio of the racemo diads can be determined from an intensity ratio between a signal derived from the meso diads at 43.35 ppm and a signal derived from the racemo diads at 43.43 ppm, with a peak of orthodichlorobenzene-d4 at 127.5 ppm as a reference shift.

The polymer ($\alpha$1) can be obtained in such a way that dicyclopentadiene as a main monomer is subjected to ring-opening polymerization and at least a part of carbon-carbon double bonds in the obtained ring-opening polymer is hydrogenated (hydrogen addition).

Dicyclopentadienes include endo and exo stereoisomers, and both of them can be used as monomers in the present invention. Alternatively, only one of the isomers may be used alone, or an isomer mixture containing the endo stereoisomer and the exo stereoisomer in an arbitrary ratio may be used. In the present invention, it is preferable to increase the ratio of one stereoisomer, because the crystallinity of the polymer (α1) is increased and a resin composition more excellent in heat resistance can be easily obtained. For example, the ratio of endo or exo stereoisomer is preferably 80% or higher, more preferably 90% or higher, and even more preferably 95% or higher. Additionally, it is preferable that the ratio of the endo stereoisomer is high, because synthesis can be facilitated.

In producing the polymer (α1), only dicyclopentadiene may be used as a monomer, or another monomer copolymerizable with dicyclopentadiene may be used. Examples of other monomers include norbornenes other than dicyclopentadiene, cyclic olefins, dienes and the like.

Another monomer is used in an amount of preferably 10 wt % or less, and more preferably 5 wt % or less based on the total amount of the monomers.

The ring-opening polymerization catalyst used for synthesizing the polymer (α1) is not particularly limited as long as it allows ring-opening polymerization of dicyclopentadiene to obtain a ring-opening polymer having syndiotacticity. A preferable ring-opening polymerization catalyst is exemplified by a catalyst containing a metal compound represented by the following formula (1).

$$M(NR^1)X_{4-a}(OR^2)_a \cdot L_b \qquad (1)$$

In the formula (1), M represents a metal atom selected from Group 6 transition metal atoms of the periodic table, $R^1$ represents a phenyl group which may have a substituent at one or more of positions 3, 4 and 5, or a group represented by $-CH_2R^3$ ($R^3$ represents a group selected from a hydrogen atom, an alkyl group which may have a substituent and an aryl group which may have a substituent), $R^2$ represents a group selected from an alkyl group which may have a substituent and an aryl group which may have a substituent, X represents a group selected from a halogen atom, an alkyl group which may have a substituent, an aryl group which may have a substituent and an alkylsilyl group, and L represents an electron-donating neutral ligand. a represents 0 or 1, and b represents an integer of 0 to 2.

M represents a Group 6 transition metal atom the periodic table (chromium, molybdenum, tungsten), and molybdenum or tungsten is preferred, and tungsten is more preferred.

The number of the carbon atoms in the phenyl group which may have a substituent at one or more of positions 3, 4 and 5 represented by $R^1$ is not particularly limited, but is normally 6 to 20, and preferably 6 to 15.

Examples of the substituent include an alkyl group such as a methyl group and an ethyl group; a halogen atom such as fluorine atom, chlorine atom and bromine atom; an alkoxy group such as a methoxy group, an ethoxy group and an isopropoxy group; and the like.

In addition, substituents at two or more of positions 3, 4 and 5 may be bound to each other to form a ring structure.

Examples of the phenyl group which may have a substituent at one or more of 3, 4, and 5 positions include an unsubstituted phenyl group; a monosubstituted phenyl group such as a 4-methylphenyl group, a 4-chlorophenyl group, a 3-methoxyphenyl group, a 4-cyclohexylphenyl group and a 4-methoxyphenyl group; a disubstituted phenyl group such as a 3,5-dimethylphenyl group, a 3,5-dichlorophenyl group, a 3,4-dimethylphenyl group and a 3,5-dimethoxyphenyl group; a trisubstituted phenyl group such as a 3,4,5-trimethylphenyl group and a 3,4,5-trichlorophenyl group; a 2-naphthyl group which may have a substituent such as a 2-naphthyl group, a 3-methyl-2-naphthyl group and a 4-methyl-2-naphthyl group; and the like.

In the group represented by $-CH2R^3$ in $R^1$, $R^3$ represents a group selected from a hydrogen atom, an alkyl group which may have a substituent and an aryl group which may have a substituent.

The number of carbon atoms in the alkyl group which may have a substituent represented by $R^3$ is not particularly limited, but is normally 1 to 20, and preferably 1 to 10. This alkyl group may be linear or branched.

Examples of the substituent include a phenyl group which may have a substituent, such as a phenyl group and a 4-methylphenyl group; an alkoxyl group such as a methoxy group and an ethoxy group; and the like.

Examples of the alkyl group which may have a substituent represented by $R^3$ include a methyl group, an ethyl group, a propyl group, an isopropyl group, a butyl group, an isobutyl group, a t-butyl group, a pentyl group, a neopentyl group, a benzyl group, a neophyl group and the like.

The number of carbon atoms in the aryl group which may have a substituent represented by $R^3$ is not particularly limited, but is normally 6 to 20, and preferably 6 to 15.

Examples of the substituent include an alkyl group such as a methyl group and an ethyl group; a halogen atom such as a fluorine atom, a chlorine atom and a bromine atom; an alkoxy group such as a methoxy group, an ethoxy group and an isopropoxy group; and the like.

Examples of the aryl group which may have a substituent represented by $R^3$ include a phenyl group, a 1-naphthyl group, a 2-naphthyl group, a 4-methylphenyl group, a 2,6-dimethylphenyl group and the like.

Above all, the alkyl group having 1 to 20 carbon atoms is preferred as the group represented by $R^3$.

Examples of the halogen atom represented by X include a chlorine atom, a bromine atom and an iodine atom.

Examples of the alkyl group which may have a substituent and the aryl group which may have a substituent represented by X include the same groups as described for the alkyl group which may have a substituent and the aryl group which may have a substituent respectively, represented by $R^3$.

Examples of the alkylsilyl group represented by X include a trimethylsilyl group, a triethylsilyl group, a t-butyldimethylsilyl group, and the like.

In addition, when the metal compound represented by formula (1) has two or more Xs, they may be bound to each other to form a ring structure.

Examples of the alkyl group which may have a substituent and the aryl group which may have a substituent represented by $R^2$ include the same groups as described for the alkyl group which may have a substituent and the aryl group which may have a substituent respectively, represented by $R^3$.

The electron-donating neutral ligand represented by L is exemplified by an electron-donating compound containing a Group 14 or 15 atom the periodic table. Specific examples thereof include phosphines such as trimethylphosphine, triisopropylphosphine, tricyclohexylphosphine and triphenylphosphine; ethers such as diethyl ether, dibutyl ether, 1,2-dimethoxyethane and tetrahydrofuran; amines such as trimethylamine, triethylamine, pyridine and lutidine; and the like. Above all, ethers are preferable.

As the metal compound represented by formula (1), a tungsten compound having a phenylimide group (a compound in which M in the formula (1) represents a tungsten atom and $R^1$ represents a phenyl group) is preferred, and tetrachlorotungsten phenylimide (tetrahydrofuran) complex is more preferred.

The method for synthesizing the metal compound represented by formula (1) is not particularly limited. For example, a conventionally known production method such as the method described in JP-A-5-345817 can be adopted.

After the metal compound is synthesized, the reaction solution may be directly used as a catalyst solution for the ring-opening polymerization reaction, or otherwise, after the metal compound is isolated and purified by a known purification treatment such as crystallization, the resulting metal compound may be subjected to ring-opening polymerization reaction.

The ring-opening polymerization catalyst may consist only of the metal compound represented by the formula (1), or may be a combination of a metal compound represented by formula (1) and an organometallic reducing agent. Use of the metal compound represented by formula (1) in combination with the organometallic reducing agent improves polymerization activity.

Examples of the organometallic reducing agent include Group 1, 2, 12, 13 and 14 organometallic compounds the periodic table having a hydrocarbon group having 1 to 20 carbon atoms.

Examples of the organometallic compound include an organolithium such as methyllithium, n-butyllithium and phenyllithium; an organomagnesium such as butylethylmagnesium, butyloctylmagnesium, dihexylmagnesium, ethylmagnesium chloride, n-butylmagnesium chloride and allylmagnesium bromide; an organozinc such as dimethyl zinc, diethyl zinc and diphenyl zinc; an organoaluminum such as trimethylaluminum, tri ethyl aluminum, triisobutylaluminum, diethylaluminum chloride, ethylaluminum sesquichloride, ethylaluminum dichloride, diethylaluminum ethoxide, diisobutylaluminum isobutoxide, ethylaluminum diethoxide and isobutylaluminum diisobutoxide; an organotin such as tetramethyltin, tetra (n-butyl) tin and tetraphenyltin; and the like.

Above all, the organoaluminum or the organotin is preferred.

The ring-opening polymerization reaction is normally carried out in an organic solvent. The organic solvent to be used is not particularly limited as long as it allows dissolution or dispersion of a ring-opening polymer or a hydrogenated product thereof under a predetermined condition and does not inhibit the ring-opening polymerization reaction or the hydrogenation reaction.

Examples of the organic solvent include aliphatic hydrocarbons such as pentane, hexane and heptane; alicyclic hydrocarbons such as cyclopentane, cyclohexane, methylcyclohexane, dimethylcyclohexane, trimethylcyclohexane, ethylcyclohexane, diethylcyclohexane, decahydronaphthalene, bicycloheptane, tricyclodecane, hexahydroindene and cyclooctane; aromatic hydrocarbons such as benzene, toluene and xylene; halogen-based aliphatic hydrocarbons such as dichloromethane, chloroform and 1,2-dichloroethane; halogen-based aromatic hydrocarbons such as chlorobenzene and dichlorobenzene; nitrogen-containing hydrocarbons such as nitromethane, nitrobenzene and acetonitrile; ethers such as diethyl ether and tetrahydrofuran; a mixed solvent containing them in combination; and the like.

Above all, the aromatic hydrocarbons, the aliphatic hydrocarbons, the alicyclic hydrocarbons and the ethers are preferred as the organic solvent.

The ring-opening polymerization reaction can be initiated by mixing a monomer, a metal compound represented by formula (1), and, if necessary, an organometallic reducing agent in an organic solvent.

In relation to the amount of the metal compound represented by formula (1) used in the ring-opening polymerization reaction, a molar ratio of (metal compound:monomer) is normally 1:100 to 1:2,000,000, preferably 1:500 to 1:1,000,000, and more preferably 1:1,000 to 1:500,000. If the amount of the metal compound is too large, it may be difficult to remove the metal compound after the reaction, and if it is too small, sufficient polymerization activity may not be obtained.

When an organometallic reducing agent is used, it is used in an amount of preferably 0.1 to 100 mol, more preferably 0.2 to 50 mol, and particularly preferably 0.5 to 20 mol based on 1 mol of the metal compound represented by formula (1). If the amount of the organometallic reducing agent to be used is too small, the polymerization activity may not be sufficiently improved, and if it is too large, side reactions may readily occur.

To the polymerization reaction system, an activity modifier may be added. The activity modifier is used, so that a ring-opening polymerization catalyst can be stabilized and the reaction rate of the ring-opening polymerization reaction and the molecular weight distribution of the polymer can be adjusted.

The activity modifier is not particularly limited as long as it is an organic compound having a functional group. Examples of activity modifier include conventionally known activity modifiers such as an oxygen-containing compound, a nitrogen-containing compound, a phosphorus-containing organic compound.

The activity modifiers may be used either alone or in combination of two or more kinds. An amount of the activity modifier to be added is not particularly limited, but it may be normally selected from a range of 0.01 to 100 mol % based on the metal compound represented by formula (1).

In addition, a molecular weight modifier may be added to the polymerization reaction system in order to adjust the molecular weight of the ring-opening polymer. Examples of the molecular weight modifier include α-olefins, an aromatic vinyl compound, an oxygen-containing vinyl compound, a halogen-containing vinyl compound, a nitrogen-containing vinyl compound, a nonconjugated diene, a conjugated diene and the like.

The molecular weight modifiers may be used either alone or in combination of two or more kinds. Although an amount of the molecular weight modifier to be added may be appropriately decided depending on the desired molecular weight, it may be normally selected within a range of 0.1 to 50 mol % based on dicyclopentadiene.

The polymerization temperature is not particularly limited, but is normally within a range of −78 to +200° C., and preferably −30 to +180° C. The polymerization time is not particularly limited and depending on the reaction scale, but is normally within a range of 1 minute to 1000 hours.

The ring-opening polymerization reaction can provide a dicyclopentadiene ring-opening polymer having syndiotacticity. In the hydrogenation reaction carried out after the ring-opening polymerization reaction, when the reaction conditions are appropriately set, normally the hydrogenation reaction does not change the tactic structure of the ring-opening polymer, and thus the desired polymer (α1) can be obtained by subjecting this dicyclopentadiene ring-opening polymer having syndiotacticity to a hydrogenation reaction. Note that the degree of syndiotacticity of the ring-opening polymer can be modulated by selection of a type of the ring-opening polymerization catalyst, or the like.

The hydrogenation reaction of the ring-opening polymer can be carried out by supplying hydrogen into the reaction system in the presence of the hydrogenation catalyst. As the hydrogenation catalyst, a homogeneous catalyst or a heterogeneous catalyst known as a hydrogenation catalyst for an olefin compound can be used.

Examples of the homogeneous catalyst include a catalyst including a combination of a transition metal compound and an alkali metal compound, such as cobalt acetate/triethylaluminum, nickel acetylacetonate/triisobutylaluminum, titanocene dichloride/n-butyllithium, zirconocene dichloride/sec-butyllithium and tetrabutoxy titanate/dimethylmagnesium; a noble metal complex catalyst such as dichlorobis (triphenylphosphine) palladium, chlorohydridocarbonyltris (triphenylphosphine) ruthenium, chlorohydridocarbonylbis (tricyclohexylphosphine) ruthenium, bis (tricyclohexylphosphine) benzylidine ruthenium (IV) dichloride and chlorotris (triphenylphosphine) rhodium; and the like.

Examples of the heterogeneous catalyst include a metal catalyst such as nickel, palladium, platinum, rhodium and ruthenium; and a solid catalyst prepared by allowing the metal to be supported by a support such as carbon, silica, diatomaceous earth, alumina and titanium oxide, such as nickel/silica, nickel/diatomaceous earth, nickel/alumina, palladium/carbon, palladium/silica, palladium/diatomaceous earth and palladium/alumina.

The hydrogenation reaction is normally carried out in an inert organic solvent. Examples of the inert organic solvent include aromatic hydrocarbons such as benzene and toluene; aliphatic hydrocarbons such as pentane and hexane; alicyclic hydrocarbons such as cyclohexane and decahydronaphthalene; ethers such as tetrahydrofuran and ethylene glycol dimethyl ether; and the like.

The inert organic solvent may be the same as the solvent used in the ring-opening polymerization reaction or may be different. In addition, a hydrogenation catalyst may be added as it is to the ring-opening polymerization reaction solution for hydrogenation reaction.

Although the reaction conditions for the hydrogenation reaction vary depending on the hydrogenation catalyst to be used, the reaction temperature is normally −20 to +250° C., preferably −10 to +220° C., and more preferably 0 to +200° C. If the reaction temperature is too low, the reaction rate may be too slow, and if the reaction temperature is too high, side reactions may occur.

The hydrogen pressure is normally 0.01 to 20 MPa, preferably 0.05 to 15 MPa, and more preferably 0.1 to 10 MPa. If the hydrogen pressure is too low, the reaction rate may be too slow, and if the hydrogen pressure is too high, a special device such as a high-pressure resistant reactor is required.

The reaction time is not particularly limited as long as the desired hydrogenation ratio can be achieved, but is normally 0.1 to 10 hours.

After the hydrogenation reaction, the desired polymer (α1) only has to be collected in accordance with a conventional method.

The hydrogenation ratio (ratio of the hydrogenated main chain double bond) in the hydrogenation reaction is not particularly limited, but is preferably 98% or higher, and more preferably 99% or higher. The higher the hydrogenation ratio is, the better the heat resistance of the obtained polymer (α1) is.

In the present invention, the polymers (A) may be used either alone or in combination of two or more kinds.

[Polymer (B)]

The polymer (B) used in the present invention is a polymer incompatible with the polymer (A) and has a heat distortion temperature of lower than 170° C.

In the present invention, incompatibility means the property that the polymer forms a sea-island structure when mixed with a polymer to form a resin composition or a resin formed article. The polymer (B) is a polymer incompatible with the polymer (A), so that the excellent heat resistance (i.e. having a high heat distortion temperature) of the polymer (A) and the flow property at a relatively low temperature of the polymer (B) in the microporous film can be respectively utilized to a satisfactory extent. As a result, the separator including the resulting microporous film has a high meltdown temperature and a low shutdown temperature.

Additionally, in the present invention, the polymer (B) to be used is incompatible with the polymer (A), and a difference between the surface tension of the polymer (A) for water and the surface tension of the polymer (B) for water [(surface tension of the polymer (A) for water)—(surface tension of the polymer (B) for water)] is preferably 2 mN/m or higher, and more preferably 3 mN/m or higher.

The difference in surface tension is 2 mN/m or higher, so that the mixture of the polymers can more easily have the sea-island structure.

The heat distortion temperature of the polymer (B) is lower than 170° C., preferably 165° C. or lower, and more preferably 160° C. or lower.

The heat distortion temperature of the polymer (B) is lower than 170° C., so that a microporous film having a lower shutdown temperature can be easily obtained.

A polymer having a low heat distortion temperature can be efficiently obtained by decreasing its molecular weight or by lowering its tactic structure.

The weight average molecular weight (Mw) of the polymer (B) is not particularly limited, but is normally 1,000 to 1,000,000, and preferably 2,000 to 500,000.

The molecular weight distribution (Mw/Mn) of the polymer (B) is not particularly limited, but is normally 4.0 or lower, and preferably 3.5 or lower.

The polymer (B) is a polymer incompatible with the polymer (A) and is not particularly limited as long as its heat distortion temperature is lower than 170° C.

Examples of the polymer (B) include polyolefin-based polymers of homopolymers, copolymers and the like of monomers such as ethylene, propylene, 1-butene, 4-methyl-1-pentene, 1-hexene and 1-octene.

Specific examples of the polymer (B) include a low density polyethylene, a linear low density polyethylene, a medium density polyethylene, a high density polyethylene, an ultrahigh molecular weight polyethylene, a polypropylene, an ethylene-propylene random copolymer, a polybutene and the like.

Above all, the high density polyethylene or the polypropylene is preferred.

In the present invention, the polymer (B) may be used either alone or in combination of two or more kinds.

[Resin Composition]

In the resin composition according to one embodiment of the invention, the content of the polymer (A) is 1 to 80 wt % based on the total weight of the polymer (A) and the polymer (B). If the content of the polymer (A) is too small, the meltdown temperature decreases when the microporous film is used as a separator, and if the content of the polymer (A) is too large, the shutdown temperature increases when the microporous film is used as a separator.

When the resin composition according to one embodiment of the invention is used as a forming material for the microporous film, the resin composition normally contains a solvent (hereinafter referred to as "pore-forming solvent" in some cases).

The pore-forming solvent is used to form micropores. A resin sheet is formed by forming a resin composition containing the pore-forming solvent, and then the pore-forming solvent in the resin sheet is removed to form micropores in the resin sheet.

The boiling point of the pore-forming solvent is normally 120 to 600° C., and preferably 150 to 500° C. The pore-forming solvent having a boiling point within this range is used, so that micropores can be efficiently formed.

Examples of the pore-forming solvent include hydrocarbon-based solvents such as nonane, decane, undecane, dodecane and liquid paraffin.

The content of the pore-forming solvent is normally 20 to 80 wt %, preferably 30 to 70 wt %, and more preferably 40 to 60 wt % based on the whole resin composition.

The resin composition according to one embodiment of the invention may contain a compatibilizer as long as the polymer (A) and the polymer (B) are separated from each other. A resin composition containing the compatibilizer is used, so that a microporous film in which an island portion including the polymer (A) is excellent in dispersibility, can be easily obtained. Such a microporous film is suitable as a material for a separator more excellent in safety.

Examples of the compatibilizer include a rubber-based polymer such as a styrene/butadiene rubber, an isoprene rubber and a chloroprene rubber, and a hydrogenated product thereof.

When the resin composition according to one embodiment of the invention contains a compatibilizer, its content is normally 0.1 to 10 wt % based on the total weight of the polymer (A) and the polymer (B).

The resin composition according to one embodiment of the invention may contain an inorganic filler. A resin composition containing an inorganic filler is used, so that a separator having a high shutdown temperature can be easily obtained.

Examples of the inorganic filler include silica, alumina, zeolite, magnesia, titania and the like.

When the resin composition according to one embodiment of the invention contains an inorganic filler, its content is normally 1 to 50 wt % based on the total weight of the polymer (A) and the polymer (B).

The resin composition according to one embodiment of the invention may further contain other additives.

Examples of the additives include an antioxidant, a crystal nucleator, a flame retardant, a flame retardant promoter, a colorant, an antistatic agent, a plasticizer, a UV absorber, a light stabilizer, a lubricant and the like.

Their contents can be appropriately decided depending on the purpose, but are normally less than 20 wt %, and preferably 10 wt % or less based on the whole resin composition.

The resin composition according to one embodiment of the invention can be obtained by melt-kneading the polymer (A), the polymer (B), and, if necessary, a solvent and an additive.

A melt kneading method is not particularly limited. For example, kneading can be carried out using a melt kneader such as a single-screw extruder, a twin-screw extruder, a Banbury mixer, a kneader, a roll and a feeder ruder.

A temperature for kneading is preferably 200 to 400° C., and more preferably 240 to 320° C. In addition, each component may be added and kneaded at a time, or may be kneaded while adding the components stepwise.

2) Microporous Film

The microporous film according to one embodiment of the invention is formed by using the resin composition according to one embodiment of the invention and has the sea-island structure made by dispersing the polymer (A) in the polymer (B).

The sea-island structure in the microporous film according to one embodiment of the invention is formed by using the polymer (A) in combination with the polymer (B) incompatible with the polymer (A). The polymer ($\alpha$1) is preferred as the polymer (A) because this sea-island structure can be easily formed.

The shape of the island portion including the polymer (A) is not particularly limited, but is normally circular or elliptical.

The average diameter of the island portion is normally 0.05 to 100 and preferably 0.1 to 50 µm.

The average diameter of the island portions can be calculated in such a way that the microporous film is observed with an electron microscope, a plurality of arbitrarily-selected islands is replaced by circles with the same areas respectively, and the diameters of the circles are measured to determine their average value.

The shape of the micropores is not particularly limited, but is normally circular or elliptical. The average diameter of the micropores is normally 0.01 to 1 µm, and preferably 0.05 to 0.3 µm.

The average diameter of the micropores can be calculated in such a way that the microporous film is observed with an electron microscope, arbitrarily-selected pores are replaced by circles with the same areas respectively, and the diameters of the circles are measured to determine their average value.

The thickness of the microporous film is not particularly limited. The thickness of the microporous film is normally 5 to 100 µm, and preferably 10 to 50 µm.

The method for producing the microporous film according to one embodiment of the invention is not particularly limited. For example, a resin composition containing a pore-forming solvent, as a forming material, is formed into a sheet by a film extruder, then the resulting resin sheet is brought into contact with a volatile solvent to extract and remove the pore-forming solvent contained in the resin composition, and subsequently the volatile solvent is removed by volatilization to obtain a microporous film in which micropores are formed in the resin sheet.

The shape of the resin (forming material) before forming is not particularly limited as long as it allows production of the microporous film. Examples thereof include e.g. a pellet, a powder and the like.

The volatile solvent is not particularly limited as long as it is a volatile solvent, mixes with the pore-forming solvent in any ratio at 30° C. and does not dissolve the polymer (A) and the polymer (B).

The boiling point of the volatile solvent is preferably 100° C. or lower, and more preferably 80° C. or lower.

When a hydrocarbon-based solvent such as a liquid paraffin is used as a pore-forming solvent, examples of the volatile solvent include aliphatic hydrocarbon-based solvents such as n-pentane, n-hexane, n-heptane and 2-methylpentane.

The process for extracting and removing the pore-forming solvent is not particularly limited. For example, the pore-forming solvent can be extracted and removed by immersing the resin sheet in a volatile solvent.

The temperature of the volatile solvent in this immersion treatment is not particularly limited, but is normally 10 to 80° C., and preferably 20 to 60° C.

The time needed for the immersion treatment is not particularly limited, but is normally 30 seconds to 1 hour, and preferably 1 to 30 minutes.

The method of removing the volatile solvent by volatilization is not particularly limited. For example, the resin sheet is heated under ordinary pressure or reduced pressure, so that the volatile solvent can be removed by volatilization.

The heating condition for the resin sheet is not particularly limited, but the heating is carried out e.g. at 20 to 150° C. for 30 seconds to 24 hours.

For the resin sheet (referring to the sheet before the volatile solvent is removed by volatilization) or the microporous film (referring to the film after the volatile solvent is removed) (hereinafter they are collectively referred to as a "resin sheet and the like"), stretching treatment or heat setting treatment may be applied.

The stretching treatment refers to a treatment that an unoriented long-chain polymer is stretched in a uniaxial or biaxial direction to orient its molecules in a stretched direction. A microporous film more excellent in strength can be obtained by the stretching treatment. The stretching treatment method is not particularly limited. Examples thereof include e.g. a uniaxial stretching method, a biaxial stretching method, a diagonal stretching method, and the like. The temperature of the resin sheet and the like in the stretching treatment is normally 100 to 140° C., and preferably 110 to 120° C.

The stretching ratio is preferably 10 or more, and more preferably 15 to 400 in area ratio.

The heat setting treatment means to a treatment that a predetermined heat is applied while the film is tensed by applying tensile force in longitudinal and width directions. The heat setting treatment can provide a microporous film having a small thermal shrinkage ratio.

The temperature of the resin sheet and the like in the heat setting treatment is normally 100 to 140° C., and preferably 110 to 120° C.

The time needed for the heat setting treatment is normally 1 to 60 seconds.

The microporous film according to one embodiment of the invention is formed using the resin composition according to one embodiment of the invention, and is suitably used as a separator for a secondary battery.

3) Separator and Secondary Battery

The separator according to one embodiment of the invention includes the microporous film according to one embodiment of the invention. Accordingly, the separator according to one embodiment of the invention has a high meltdown temperature and a desired shutdown temperature.

The meltdown temperature of the separator according to one embodiment of the invention is normally higher than 260° C. and the shutdown temperature is normally 170° C. or lower.

The meltdown temperature and the shutdown temperature can be measured by the method described in Examples.

The polymer (A) (alicyclic structure-containing hydrogenated polymer) constituting the separator of the present invention is excellent in electrical insulation and chemical resistance. Thus, the separator according to one embodiment of the invention hardly causes short circuit or deterioration due to a chemical reaction.

Furthermore, the separator according to one embodiment of the invention has a high meltdown temperature and a desired shutdown temperature as described above.

Since the separator according to one embodiment of the invention has the above properties, it is extremely excellent in safety and practicability.

The secondary battery according to one embodiment of the invention includes the separator according to one embodiment of the invention. In addition, the secondary battery according to one embodiment of the invention normally has a positive electrode, a negative electrode and an electrolyte component.

The secondary battery according to one embodiment of the invention can be produced e.g. in such a way that the positive electrode and the negative electrode are superimposed via a separator, this is put in a battery container by, if necessary, winding, folding or the like depending on the shape of the battery, an electrolytic solution is poured into the battery container, and the opening is sealed. In order to prevent raised pressure in the secondary battery, over discharge and charge, and the like, an overcurrent-preventing element such as a fuse and a PTC element, an expanded metal, a lead plate, or the like may be provided as required. The shape of the secondary battery may be any shape e.g. a coin shape, a button shape, a sheet shape, a cylindrical shape, a square shape, a flat shape and the like.

The present invention will be further described below by way of Examples and Comparative Examples in detail. Note that the present invention is not limited to the following examples. Hereinafter, the units "parts" and "%" respectively refer to "parts by weight" and "wt %" unless otherwise indicated.

EXAMPLES

In Examples and Comparative Examples, each property was measured in accordance with the following methods.
(1) Molecular Weight (Weight Average Molecular Weight and Number Average Molecular Weight) of the Alicyclic Structure-Containing Polymer A molecular weight of the alicyclic structure-containing polymer was determined as a standard polystyrene-equivalent value by gel permeation chromatography (GPC) using tetrahydrofuran as a solvent at 40° C.
System: HLC-8220, manufactured by Tosoh Corporation
Column: H-type column, manufactured by Tosoh Corporation
(2) Hydrogenation Ratio in Hydrogenation Reaction of Alicyclic Structure-Containing Polymer A hydrogenation ratio in the hydrogenation reaction of the alicyclic structure-containing polymer was determined by $^1$H-NMR measurement.
(3) Melting Point of the Alicyclic Structure-Containing Hydrogenated Polymer A melting point of the alicyclic structure-containing hydrogenated polymer was measured by carrying out thermogravimetry while rising the temperature at a rate of 10° C./minute using a differential scanning calorimeter.
(4) Ratio of Racemo Diads in the Alicyclic Structure-Containing Hydrogenated Polymer A ratio of racemo diads in the alicyclic structure-containing hydrogenated polymer was determined on the basis of an intensity ratio between a signal derived from the meso diads at 43.35 ppm and a signal derived from the racemo diads at 43.43 ppm by $^{13}$C-NMR measurement using a mixed solvent of 1,3,5-trichlorobenzene-d3/orthodichlorobenzene-d4 (volume ratio: 2/1) as a solvent at 200° C.

(5) Heat Distortion Temperature

A Vicat softening point was measured under conditions of a load of 50 N and an increase rate of 50° C./hour using an HDT tester (6M-2, manufactured by Toyo Seiki Seisakusho, Ltd.) in accordance with JIS K 7206, and this Vicat softening point was defined as a heat distortion temperature.

(6) Surface Tension

A surface tension was determined by measuring a contact angle in a case of using water (ion exchanged water) as a solvent, by means of an automatic contact angle meter (DropMaster DM500 type, manufactured by Kyowa Interface Science Co., LTD.).

(7) Shutdown Temperature

Using a thermomechanical analyzer (TMA/SS6100, manufactured by Seiko Instruments Inc.), a test piece of 10 mm (TD)×3 mm (MD) was heated from room temperature (20° C., the same applies to the following) at a rate of 5° C./minute while being stretched in a longitudinal direction of the test piece at a load of 2 g, and a temperature of an inflection point observed near the melting point was defined as a shutdown temperature. A test piece having the shutdown temperature of 170° C. or lower was rated as "Good", and a test piece having the shutdown temperature of higher than 170° C. was rated as "Bad".

(8) Meltdown Temperature

Using the thermomechanical analyzer, a test piece of 10 mm (TD: Transverse Direction)×3 mm (MD: Machine Direction) was heated from room temperature at a rate of 5° C./minute while being stretched in a longitudinal direction of the test piece at a load of 2 g, and a temperature at which the film was broken by melting was defined as a meltdown temperature. A test piece having the meltdown temperature of higher than 260° C. was rated as "Good", and a test piece having the meltdown temperature of 260° C. or lower was rated as "Bad".

Production Example 1

A glass pressure-resistant reactor whose inside had been sufficiently dried and then replaced by nitrogen, was charged with 40 parts of cyclohexane solution containing dicyclopentadiene (content of endo stereoisomers: 99% or more) (concentration: 75%) (30 parts of dicyclopentadiene), to which 738 parts of cyclohexane and 2.0 parts of 1-hexene were further added, and heated to 50° C. while stirring the whole content.

On the other hand, 4.6 parts of diethylaluminum ethoxide/n-hexane solution (concentration: 19%) was added to a solution prepared by dissolving 1.1 parts of tetrachlorotungsten phenylimide (tetrahydrofuran) complex in 56 parts of toluene, which was stirred for 10 minutes to prepare a catalyst solution.

While stirring the contents in the reactor, this catalyst solution was added to the reactor to start a ring-opening polymerization reaction. Subsequently, 40 parts of cyclohexane solution containing dicyclopentadiene (concentration: 75 wt %) was added nine times (total addition amount of dicyclopentadiene: 270 parts) every 5 minutes while maintaining the whole content at 50° C., and then the reaction was further continued at 50° C. for 2 hours.

Subsequently, a small amount of isopropanol was added to the reaction solution to terminate the polymerization reaction, and then the polymerization reaction solution was poured into a large amount of isopropanol to precipitate a ring-opening polymer. The precipitated polymer was collected by filtration. The resulting ring-opening polymer was dried under reduced pressure at 40° C. for 20 hours.

The yield of the polymer was 296 parts (yield: 99%). In addition, the number average molecular weight (Mn) and the weight average molecular weight (Mw) of this polymer were 14,200 and 27,000, respectively, and the molecular weight distribution (Mw/Mn) determined from them was 1.90.

Subsequently, 60 parts of the resulting ring-opening polymer and 261 parts of cyclohexane were added to a pressure-resistant reactor and stirred to dissolve the polymer in cyclohexane, to which a hydrogenation catalyst solution prepared by dissolving 0.039 part of chlorohydridocarbonyltris(triphenylphosphine)ruthenium in 40 parts of toluene was subsequently added, and the hydrogenation reaction was carried out at a hydrogen pressure of 4 MPa and 160° C. for 5 hours. The resulting reaction solution was poured into a large amount of isopropyl alcohol to completely precipitate the polymer. The precipitate was taken by filtration, which was washed with isopropyl alcohol and then dried under reduced pressure at 60° C. for 24 hours to obtain 27.2 parts (yield: 98%) of hydrogenated dicyclopentadiene ring-opening polymer.

The resulting hydrogenated dicyclopentadiene ring-opening polymer had a hydrogenation ratio of 99% or higher, a ratio of racemo diads of 85%, and a melting point of 265° C.

Physical properties of the resin components used in Examples and Comparative Examples are shown below.

Hydrogenated dicyclopentadiene ring-opening polymer (Production Example 1) (hereinafter abbreviated as "COP" in some cases)

Heat distortion temperature: 263° C., Surface tension: 34 mN/m

High density polyethylene (HF 560, manufactured by Japan Polyethylene Corporation) (hereinafter abbreviated as "HDPE" in some cases)

Heat distortion temperature: 122° C., Surface tension: 31 mN/m

Polypropylene (F-300SP, manufactured by Prime Polymer Co., Ltd.) (hereinafter abbreviated as "PP" in some cases)

Heat distortion temperature: 162° C., Surface tension: 29 mN/m

Example 1

60 parts of COP and 40 parts of HDPE were kneaded using a twin-screw extruder (TEM-37BS, manufactured by TOSHIBA MACHINE CO., LTD.) at a resin temperature of 270° C. At that time, a liquid paraffin was supplied from a side feeder so that the amount was 50% based on the whole resin composition.

The resulting resin composition was put into a film extruder (manufactured by GSI Creos Corporation), which was allowed to pass through a gear pump and a T die, and formed into a resin sheet having a thickness of 50 μm.

The resulting sheet was immersed in an n-hexane solution for 3 minutes to remove the liquid paraffin. Subsequently, the sheet was set by heating while fixing the four sides of the sheet at 120° C. for 30 seconds to obtain a microporous film. This sheet was used as a test piece to measure the shutdown temperature and the meltdown temperature.

Examples 2 to 5, and Comparative Examples 1 to 4

Resin compositions and microporous films were obtained and their shutdown temperatures and the meltdown temperatures were measured in the same manner as in Example 1 except that, in Example 1, the resin components were changed to those shown in Table 1.

TABLE 1

| | Resin component (part) | | | Shutdown temperature | Meltdown temperature |
|---|---|---|---|---|---|
| | COP | HDPE | PP | | |
| Example 1 | 60 | 40 | | Good | Good |
| Example 2 | 40 | 60 | | Good | Good |
| Example 3 | 20 | 80 | | Good | Good |
| Example 4 | 1 | 99 | | Good | Good |
| Example 5 | 1 | | 99 | Good | Good |
| Comparative Example 1 | 0.5 | 99.5 | | Good | Bad |
| Comparative Example 2 | 90 | 10 | | Bad | Good |
| Comparative Example 3 | | 100 | | Good | Bad |
| Comparative Example 4 | 100 | | | Bad | Good |

From Table 1, the followings can be seen.

The microporous films obtained in Examples 1 to 5 have low shutdown temperatures and high meltdown temperatures. Thus, separators including these microporous films are excellent in safety.

On the other hand, the microporous films obtained in Comparative Examples 1 and 3 have low meltdown temperatures, and the microporous films obtained in Comparative Examples 2 and 4 have high shutdown temperatures. Thus, the separators including these microporous films are poor in safety.

The invention claimed is:

1. A microporous film formed by using a resin composition, wherein
    the resin composition contains a polymer (A) and a polymer (B), wherein a content of the polymer (A) is 1 to 80 wt% based on the total weight of the polymer (A) and the polymer (B);
    polymer (A) is an alicyclic structure-containing hydrogenated polymer having a heat distortion temperature of 170° C. or higher and a melting point range from 180° C. to 350° C.;
    polymer (B) is a polymer incompatible with the polymer (A) and having a heat distortion temperature of lower than 170° C.;
    the microporous film has a sea-island structure constructed by dispersing the polymer (A) in the polymer (B);
    an average diameter of island portions in the sea-island structure is from 0.05 to 100 μm; and
    an average diameter of micropores in the microporous film is 0.01 to 1 μm.

2. A separator including the microporous film according to claim 1.

3. A secondary battery having the separator according to claim 2.

4. The microporous film of claim 1, wherein
    a difference between a surface tension of the polymer (A) for water and a surface tension of the polymer (B) for water is 2 mN/m or more.

5. The microporous film of claim 1, which is made by a process wherein:
    a resin sheet formed of the resin composition contains the polymer (A), the polymer (B), and a pore-forming solvent, the pore-forming solvent used as a forming material, wherein the content of the polymer (A) is 1 to 80 wt% based on the total weight of the polymer (A) and the polymer (B);
    the resin sheet is brought into contact with a volatile solvent to extract and remove the pore-forming solvent in the resin composition; and
    the volatile solvent is removed from the resin composition by volatilization.

6. A method for producing the microporous film of claim 1, comprising:
    forming a resin sheet of the resin composition containing the polymer (A), the polymer (B), and a pore-forming solvent, the pore-forming solvent used as a forming material, wherein the content of the polymer (A) is 1 to 80 wt% based on the total weight of the polymer (A) and the polymer (B);
    bringing the resin sheet into contact with a volatile solvent to extract and remove the pore-forming solvent in the resin composition; and
    removing the volatile solvent by volatilization.

* * * * *